US005268648A

United States Patent [19]

Calcatera

[11] Patent Number: 5,268,648

[45] Date of Patent: Dec. 7, 1993

[54] FIELD EMITTING DRAIN FIELD EFFECT TRANSISTOR

[75] Inventor: Mark C. Calcatera, Spring Valley, Ohio

[73] Assignee: The United States of America as represented by the Secretary of the Air Force, Washington, D.C.

[21] Appl. No.: 912,476

[22] Filed: Jul. 13, 1992

[51] Int. Cl.[5] .................... H03F 5/00

[52] U.S. Cl. .................... 330/3; 313/309; 313/336; 330/277

[58] Field of Search .................... 330/3, 277; 313/309, 313/336, 351

[56] References Cited

U.S. PATENT DOCUMENTS 4,721,885 1/1988 Brodie .................... 313/576
4,780,684 10/1988 Kosmahl .................... 330/54
4,901,028 2/1990 Gray et al. .................... 330/54
4,987,377 1/1991 Gray et al. .................... 330/54
5,103,145 4/1992 Doran .................... 313/309 X

*Primary Examiner*—James B. Mullins
*Attorney, Agent, or Firm*—Gerald B. Hollins; Donald J. Singer

[57] ABSTRACT

A field emitting drain field effect transistor (FEDFET) device which combines the desirable frequency response and current control characteristics of a field effect transistor (or other transistor) with the higher voltage higher power level characteristics of a field emission triode vacuum tube device to provide characteristics improved over those of either component element. The combination device is physically as well as electrically integrated in a semiconductor like structure. Equivalent circuit and frequency response characteristics are disclosed.

16 Claims, 3 Drawing Sheets

FIELD EMITTING DRAIN FIELD EFFECT TRANSISTOR

RIGHTS OF THE GOVERNMENT

The invention described herein may be manufactured and used by or for the Government of the United States for all governmental purposes without the payment of any royalty.

BACKGROUND OF THE INVENTION

Most of the devices developed to date for microwave power amplification, can be broadly classified as being either "solid state" or "thermionic" in nature. The solid state class of these devices generally utilize a semiconductor material such as silicon or gallium arsenide, and are dominated by transistor structures such as the metal-semiconductor field effect transistor (MESFET), or the heterojunction bipolar transistor (HBT). These devices have excellent frequency response capability, with unity gain frequencies up to several hundred gigahertz, along with good input/output isolation and good stability. However, since these transistors must operate at bias levels of typically 8 to 12 volts, their power densities are limited to about 100 watts per square centimeter and it becomes impractical to design discrete devices with power levels exceeding a few watts per device.

Thermionic devices, or vacuum tubes, have traditionally served as the "workhorse" for high power amplification at microwave frequencies. These devices, such as the traveling wave tube (TWT) and the crossed field amplifier (CFA) are capable of providing output powers of from a few watts to megawatts. However, these tubes generally operate at difficult to handle voltage levels of several thousand volts, and are generally large and bulky due to the electron beam focussing and attendant magnet structure required for operation. In addition, these tubes generally employ complicated, precision three-dimensional circuit structures that are expensive to fabricate and are generally not amenable to mass production techniques.

The patent art discloses several examples of inventions of general background interest with respect to the present invention. Included in these examples is the U.S. Pat. No. 4,721,885 of Ivor Brodie which is concerned with very High Speed Integrated Microelectronic Tubes; the U.S. Pat. No. 4,780,684 of H. G. Kosmahl which is concerned with a Microwave Integrated Distributed Amplifier with Field Emission Triodes, the U.S. Pat. No. 4,901,028 of H. F. Gray et al which is concerned with Field Emitter Array Integrated Distributed Amplifiers; and the U.S. Pat. No. 4,987,377 also of H. F. Gray et al which is additionally concerned with distributed amplifiers and is a continuation of the '028 patent.

Although each of these patents relates to field emission electronic devices none of these patents teaches the combination of a field emission device with a solid state transistor device and the number of significant improvements which can be achieved therewith.

SUMMARY OF THE INVENTION

The present invention provides for the combining of a field emission device such as a field emission triode with a transistor device such as a metal semiconductor field effect transistor (MSFET) in for example a microwave amplifier array. The combined MSFET and field emission device is herein called a Field Emitting Drain Field Effect Transistor (FEDFET) and has improved frequency response and manufacturing tolerance characteristics plus other advantages.

An object of the present invention is therefore to provide a microwave power amplification device which offers high frequency of operation, i.e. unity gain frequencies on the order of 10 to 100 GHz.

Another object of the invention is to provide a microwave power amplification device having high power density capability, density on the order of 10 to 50 times higher than microwave transistors.

Another object of the invention is to provide a microwave power amplification device capability having high power per device, i.e. on the order of 100 to 500 watts per device, at 10 GHz.

It is another object of the invention to provide a means to limit the current flow in a microelectronic field emission triode-like structure.

Another object of the invention is to provide a microwave power amplification device having current flow limiting achieved by integrating transistor elements in series with sections of a microwave field emission triode.

Another object of the invention is to provide a microwave power amplification device wherein transistors serve as controlled current sources to prevent field emitter current from reaching a catastrophic burnout level.

It is a further object of the invention to provide a means to extend the useful operating frequency of the microelectronic field emission triode by integrating therein a microwave transistor in a series configuration.

It is a further object of the invention to stabilize the operation of a field emission triode device with respect to mechanical and compositional tolerances incurred in its fabrication.

It is another object of the invention to provide a field emission device in which the effect of fabrication tolerances on the volts versus current characteristics is decreased in comparison with similar devices.

It is another object of the invention to improve both the frequency response and fabrication tolerance sensitivity of individual field emission devices in an array of such devices.

Additional objects and features of the invention will be understood from the following description and claims and the accompanying drawings.

These and other objects of the invention are achieved by transistorized microelectronic field emission triode microwave amplifier device apparatus comprising the combination of:

a semiconductor substrate member received field effect transistor;

said transistor comprising source, gate and drain elements disposed along said substrate member and a charge carrier region located within said substrate member;

a field emission triode member disposed adjacent said field effect transistor within an evacuated enclosure;

said field emission triode member having a field emission electrode source of electrons which includes an apex portion having electrical connection with said field effect transistor drain element; plus an extraction grid member having an aperture portion disposed around said field emission electrode apex portion; plus an anode member disposed across an electron travel space region from said field emission electrode and extraction grid members.

DETAILED DESCRIPTION

A class of vacuum devices, referred to as "vacuum microelectronics devices", has been developed recently. These devices employ the microelectronic fabrication technology used in the semiconductor industry to realize miniature triode-like electronic structures which employ field-emission cathodes in an array configuration. These devices offer higher power densities than solid state amplifiers, provide operation at desirable voltage and current levels of several hundred volts and a few amperes and have lower production cost than vacuum tubes due to their fabrication with microelectronic batch processing techniques. However, these devices have several disadvantages and limitations when used for microwave power amplification.

First, because of a limitation that the field emitter employed in such amplifiers can only operate at current levels in the microampere to miliampere range, practical circuits are required to employ arrays consisting of thousands of individual field emitters, each having a field emitter tip, connected in parallel. Small manufacturing variations in the fabrication of these field emitter tips, however, often result in current imbalance in the array and leads to operational burnout of portions of the field emitter tips of the array. Such burnout is attributed to the extreme sensitivity of the current/voltage relationship in the field emitter tip structure to manufacturing variations.

An additional limitation of this device is its relatively low current gain cutoff frequency, which is typically a few gigahertz compared to the over 100 gigahertz achievable with transistors. A device which combines the excellent frequency response and stability of the solid state transistor with the high power density properties of the microelectronic triode is therefore desirable in the art.

The present invention therefore involves a hybrid solid state plus vacuum tube microelectronic device i.e. a microwave field effect transistor (FET) integrated in series with an array of drain resident microelectronic field emitter devices, (FED).

Figure 1:
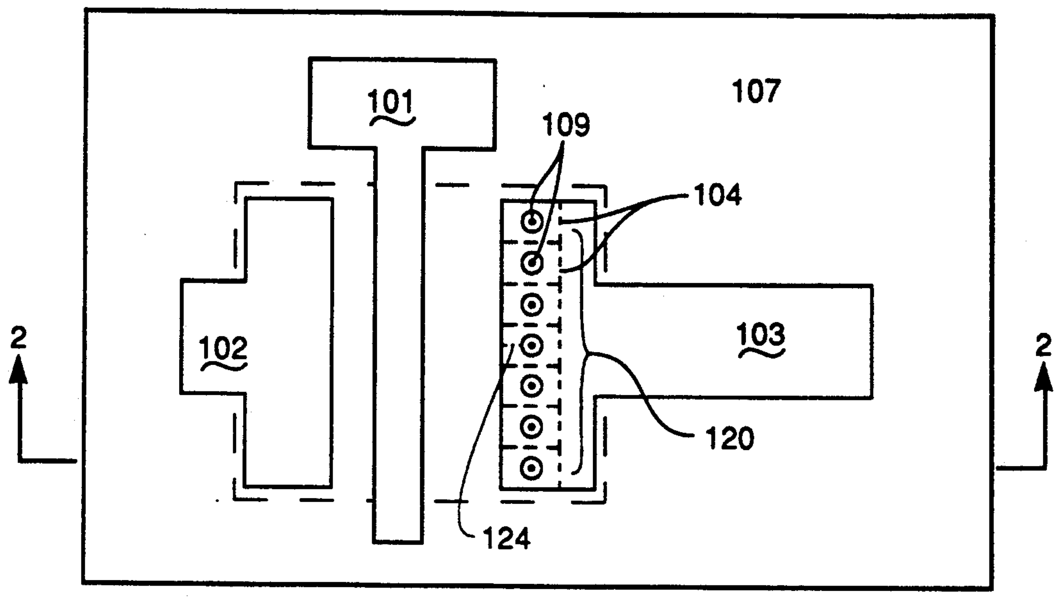
FIG. 1 shows a top view of a small FEDFET array in accordance with the invention.
Figure 2:
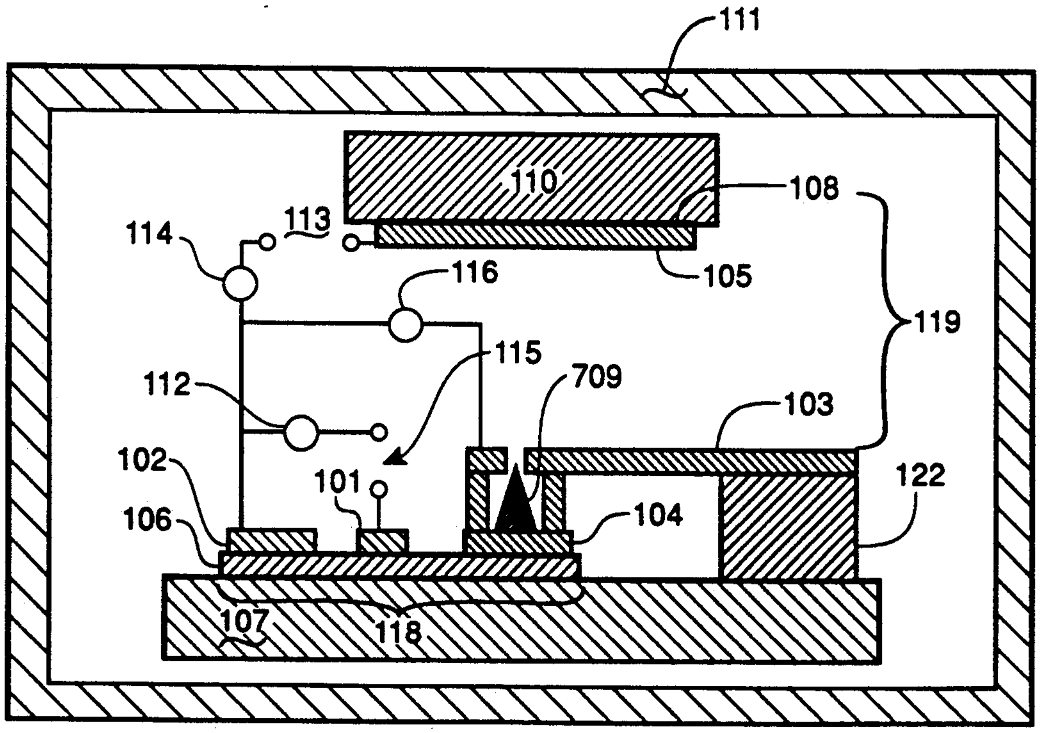
FIG. 2 shows a pseudo cross sectional view of the FIG. 1 device.

The structure of a field emission drain field effect transistor (FEDFET) is shown in layout or top view in FIG. 1 of the drawings and in pseudo cross section in FIG. 2. The term pseudo cross section here is used in deference to the fact that only selected significant portions of the FIG. 1 drawing are shown in FIG. 2. Referring first to FIG. 2, the FEDFET device is received on a semi-insulating semiconductor substrate 107, such as gallium arsenide, in a manner similar to the conventional Metal-Semiconductor Field Effect Transistor (or MESFET) known to the semiconductor industry. In the FEDFET, however, the drain electrode portion of the FET device is segmented into a multiplicity of islands 104, as are indicated in both FIG. 1 and FIG. 2. Each island 104 is also provided with an individual field emitter cathode tip 109 which is in reality also a part of the field emitting triode portion 119 of the FIG. 1 and 2 apparatus. Each field emitter cathode tip 109 is in effect fed by an independent FET current source in the FIG. 1 and 2 device.

This isolation in fact contributes to one advantage of the FIG. 1 and 2 apparatus over the unaided field emission diode or triode because the spacing and operating voltage of the field emitter are no longer so critical as to result in burn out or non operation of individual emitters in an array. That is, the current source nature of the drain electrode output from the transistor 118 in FIG. 2 allows the operating potential of the field emitter tip 109 to self adjust during device energization to a voltage which supports the intended current flow in the transistor and triode portions of the FEDFET. Each individual drain island 104 and its associated field emitter tip 109, even though fabricated on a common drain electrode element 104, is effectively isolated electrically in the intended manner by the sheet resistance of the drain electrode element 104 and the fact that the shortest path to each field emitter tip is essentially an isolated straight line within the source element structure as is shown at 124 for example. As is shown in the FIG. 1 drawing the source element 102 and gate element 101 of the transistor 118 in FIG. 2 are common to the plurality 120 of drain islands 104 and field emitter tip 109 path.

With respect to fabrication, following a conventional formation of the FET portion of the FIG. 1 and FIG. 2 FEDFET, the field emitter 109, and extractor electrodes 103 may be fabricated using techniques already developed for microelectronic triodes. The extractor electrode is supported and insulated from the semiconductor substrate 107 using a suitable dielectric material 122, such as silicon nitride.

An anode electrode 105, is physically removed from the transistor portion 118 of the FIG. 1 device and is fabricated as a remote electrical conductor attached to a thermally conductive insulator 108 of material such as aluminum nitride or diamond. The insulator 108 is in turn attached to a transistor segregated heat sink 110, in order to accommodate the power dissipation and high voltage of the combined device. In operation, the FIG. 1 and FIG. 2 FEDFET device is biased using the three voltage sources shown in FIG. 2. The gate voltage, Vg, from the source 112 controls the average current flow in the device as in a conventional FET. Vg is typically adjusted to provide a quiescent current that is one-half of the Idss maximum current of the FET portion of the device for typical class-A operation. An input signal for the FIG. 1 and FIG. 2 device is applied at the pair of terminals 115 in FIG. 2 (also shown in FIG. 6) and carries a modulation of the bias level from the source 112, the bias level appearing on the gate element 101 of the transistor 118. The signal source applied at the terminals 115 is represented at 117 in FIG. 6 of the drawings.

The extractor voltage, Ve from the source 116 divides between the FET drain to source region (i.e. a Vds voltage), and the triode s extractor to cathode region (i.e. a Vec) voltage, so that for static operation, $$Ve = Vds + Vec \quad (1)$$

Figure 3:
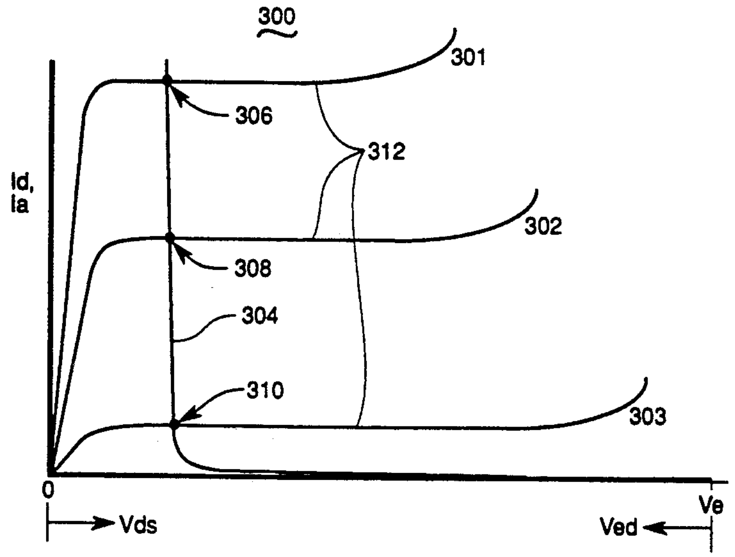
FIG. 3 shows a composite V/I characteristic plot for the FIG. 1 FEDFET.

This relationship is shown graphically by the family of curves 300 in FIG. 3, for three different gate bias voltage levels, Vgs indicated at 301, 302 and 303. The bias voltage Ve is chosen to be large enough to ensure that both the FET and triode portions of the device are turned "on" under maximum current level (Idss) conditions. Safe operation of the device is insured if Ve is low enough to avoid the breakdown voltage region of the FET, and if the Idss of each drain segment is lower than the maximum current rating of the field emitter.

The anode voltage, Va from the source 114 in FIG. 2, determines the potential of electrons delivered to the anode electrode 105 and therefore the device operating power level. This voltage is limited by power dissipation considerations at the anode electrode, however the FIG. 1 and FIG. 2 device is capable of several hundred volt operation as is reported for other field emission devices. The output signal from the FIG. 1 and FIG. 2 device appears across a load that connects with the pair of terminals 113, located between the source 114 and the anode 105. As is indicated by the enclosure 111 in FIG. 2, the FEDFET is operated in an evacuated and closed atmosphere of the type employed for other vacuum tube devices. Pressure sealed terminals of the type known in the art are contemplated for communicating bias and input/output signals to appropriate nodes of the FEDFET through the enclosure 111.

Figure 4:
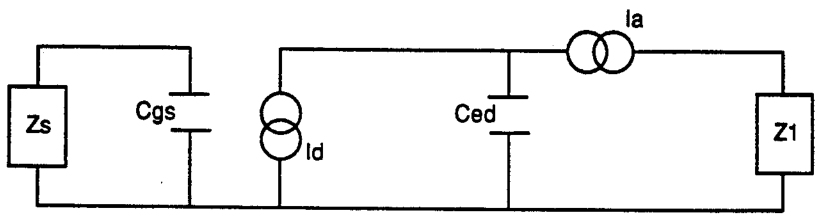
FIG. 4 shows a small signal equivalent circuit for the FIG. 1 FEDFET.
Figure 5:
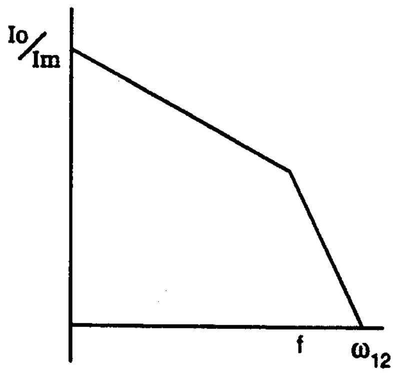
FIG. 5 shows the Bode plot characteristics for the FIG. 1 and FIG. 4 FEDFET.
Figure 6:
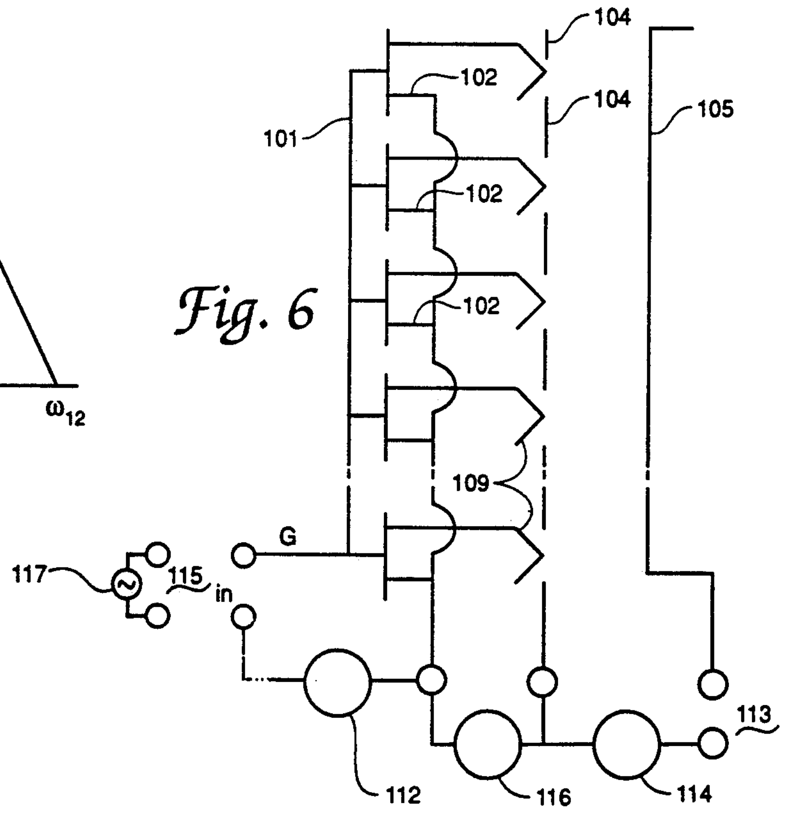
FIG. 6 shows an electrical schematic equivalent circuit for a small array of FIG. 1 FEDFET devices.

The frequency response of the FIG. 1 and FIG. 2 FEDFET can be determined by considering the array equivalent schematic circuit of FIG. 6, which leads to the simplified small signal equivalent circuit of FIG. 4. The elements identified in FIGS. 1 and 2 are also identified in the array equivalent schematic of FIG. 6 using the same identification numbers to the best degree possible. The extractor element 103 in the following frequency response determination is considered to be ac grounded, resulting in a "cascode" mode of operation for the FEDFET. From FIG. 4 it is seen that the small signal current gain of the device is predicted by:

$$i_{out}/i_{in} = (g_{m1}\, g_{m2})/j\omega C_{gs}(g_{m2} - j\omega C_{ed}) \quad (2)$$

The subscripts 1 and 2 in this equation refer to the transistor and triode portions 118 and 119 respectively of the FIG. 1 and FIG. 2 FEDFET. The $g_m$, j, and $\omega$ terms have their usual transconductance, imaginary operator, and angular frequency meanings.

Substituting for the unity gain cutoff frequencies $\omega_{t1}$ and $\omega_{t2}$ of the triode and FET sections of the device, respectively:

$$\omega_{t1} = g_{m1}/C_{gs} \text{ and } w_{t2} = g_{m2}/C_{ed} \quad (3)$$

and solving for the magnitude of the current gain:

$$|i_{out}/i_{in}| = [(\omega/\omega_{t1})^2\,(1+(\omega/\omega_{t1})^2)^{-\frac{1}{2}} \quad (4)$$

Then assuming that the FET portion of the device has a higher cutoff frequency than the triode portion, or:

$$\omega_{t1} >> \omega_{t2} \quad (5)$$

For low frequency operation, where $\omega >> \omega_{t2}$, the current gain is approximately given by:

$$|i_{out}/i_{in}| = \omega_{t1}/\omega \quad (6)$$

which is the same response as the FET portion of the device.

For high frequency operation, where $\omega >> \omega_{t2}$, the current gain is then approximately given by:

$$|i_{out}/i_{in}| = (\omega_{t1}\,\omega_{t2})/\omega^2 \quad (7)$$

and therefore the current gain cutoff frequency is given by:

$$\omega_{t12} = (\omega_{t1}\,\omega_{t2})^{\frac{1}{2}} \quad (8)$$

That is, the FEDFET cutoff frequency is approximately the geometric mean of the cutoff frequencies of the FET and triode portions of the combinations FEDFET. It is especially notable in this result that addition of the FET 118 to the triode 119 has in essence improved the frequency response of the triode.

The curve 304 in FIG. 3 represents the electrical characteristics of the field emission triode 119 in the FIGS. 1 and 2 apparatus. In a similar manner the family of curves 312 represents characteristics of the FET 118 in FIG. 1. Possible operating points for the FEDFET device are indicated by the intersection of these curves at 306, 308, and 310 in FIG. 3. Operating points intermediate these points are of course, also possible depending on the magnitude of Vgs selected.

The field emission drain field effect transistor or FEDFET name for the FIG. 1 and 2 device is of course but one of several possible names which could be used. This herein employed name is technically descriptive of the device and does provide the convenient FEDFET acronym. Another technically descriptive name such as Field Effect Transistorized Field Emission Device (FETFED) could also be used for the device in addition to numerous other possibilities as may occur to persons skilled in the electronic art.

The FEDFET device retains many of the desirable features of the microwave MESFET, including high cutoff frequency, excellent input/output isolation, stability and linearity, and adds new desirable features characteristic of the microelectronic triode, including high voltage and high power density capabilities. By increasing the voltage handling capability of the FET from the 10 to 20 volt level up to several hundreds of volts, the power density capability of the device is increased by a factor of approximately 20 to 50 times. This means that individual FEDFET devices can generate 10 GHz power levels of 100 to 500 watts instead of the 5 to 10 watt limit of the FET.

The FEDFET is also superior to the microelectronic triode in several respects. The FEDFET has a higher current gain and a higher cutoff frequency of operation than the triode, since the FEDFET cutoff frequency is the geometric mean of the FET and triode portions of the device. This means, in the typical case of 50 GHz for the $f_t$ of the FET portion, and 5 GHz for the $f_t$ of the triode portion, the FEDFET will have an $f_t$ of 15.8 GHz. This represents a raising of the usable operating frequency of the triode by more than a factor of three.

The herein disclosed FEDFET structure also controls or limits the currents applied to the field emission portion of the composite device. This control has the effect of reducing burnout problems relative to a conventional field emission triode. The FEDFET current transfer characteristic are also be more linear than those of the triode, since current control resides primarily in the FET portion of the device.

ALTERNATIVE ARRANGEMENTS

In addition to use of the herein described MESFET in the FEDFET, many other microwave transistor structures, such as the static induction transistor (SIT), or the high electron mobility transistor (HEMT) may be used in the transistor portion of the FEDFET.

Figure 7:
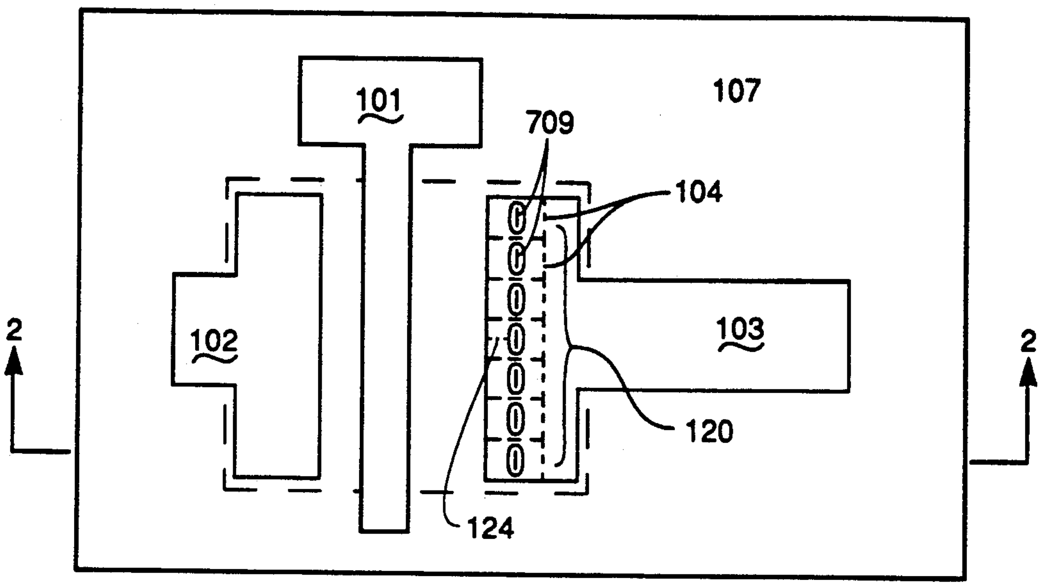
FIG. 7 shows an alternate field emitter arrangement of the invention.

There are also alternative arrangements for the field emission drain portion of the device. In addition to the preferred emitter configuration consisting of individual conical field emitters connected to separate drain segments of the FET portion, each drain segment may alternatively feed an array of field emitters, or a wedge emitter (as shown at 709 in FIG. 1 of the drawings), in order to increase the current density characteristics of the device. The FIG. 7 wedge emitter arrangement of the invention is related in appearance to the conical emitter arrangement shown in FIGS. 1 and 2 and in fact may have exactly the cross sectional appearance shown in FIG. 2.

A distributed version of the FEDFET, in which the field emission drain and the anode portions of the FEDFET are arrayed on transmission line sections with appropriate phase matching and line terminations, may be used to increase the inherent FEDFET device's gain-bandwidth capability. Arrangements of this type are described in the above referred-to two patents of H. F. Gray and also in the patent of H. G. Kosnahl (which are all hereby incorporated by reference herein) for the unaided field emission triode device.

Figure 8:
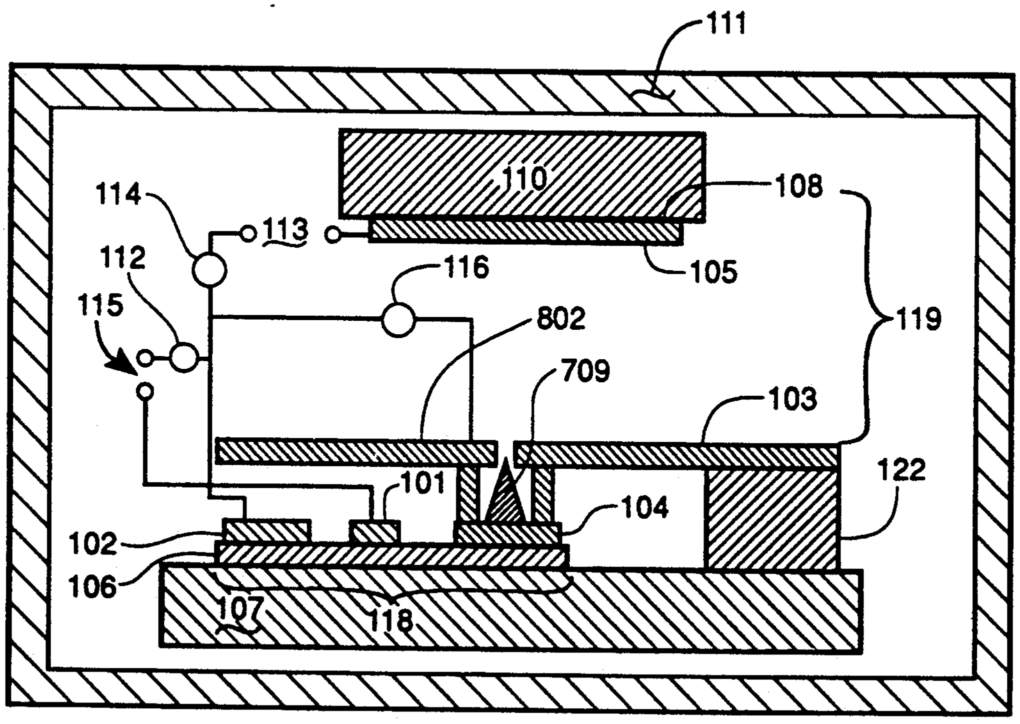
FIG. 8 shows an enlarged extractor alternate arrangement of the invention.

The extractor electrode 103, in the FIG. 1 and 2 device may be enlarged in size to extend over the active semiconductor region of the transistor 118 in another arrangement of the invention. In this configuration, as shown in FIG. 8, the extractor extension 802 acts to shield the transistor region from possible damaging effects due to secondary electrons or ions produced by the device electron beam-especially secondary electrons or ions reflecting from the anode 105.

In addition to the FEDFET mode of operation described above-in which the extractor terminal 103 of the device is held at radio frequency ground by a suitably sized external capacitance (i.e. a low pass design), an arbitrary reactive termination may be used at the extractor terminal in order to extend the frequency response of the device and accomplish a band-pass design.

As an alternative to the remote anode configuration of the FEDFET as shown in FIG. 1, the anode electrode may be integrated onto the same substrate as the remainder of the device. This arrangement requires an alternate means to remove heat from the anode electrode, such as flipping the chip onto a thermally conductive dielectric substrate of aluminum nitride or diamond for example.

As indicated above, the described arrangement of the FEDFET employs a grounded grid or cascode connection of the field emission triode device. To the extent permitted by the available signal level range of the FET or other transistor portion of the device, a drain to extractor connection or grounded cathode or grounded field emitter electrode arrangement may also be employed-with an attending change of device characteristics. In a similar manner, a source to extractor or source to emitter tip connection may also be used with different electrical characteristics.

While the apparatus and method herein described constitute a preferred embodiment of the invention, it is to be understood that the invention is not limited to this precise form of apparatus or method, and that changes may be made therein without departing from the scope of the invention, which is defined in the appended claims.

I claim:

1. Transistorized field emission triode microwave amplifier apparatus comprising the combination of:

a semiconductor substrate member received microwave field effect transistor;

said microwave transistor comprising source, gate, and drain elements disposed along said substrate member and a charge carrier region located within said substrate member;

a field emission microwave triode member disposed adjacent said microwave field effect transistor within an evacuated enclosure;

said field emission microwave triode member including a field emission electrode source of electrons which includes an apex portion electrically connected with said microwave field effect transistor drain element; and an extraction grid member having an aperture portion disposed around said field emission electrode apex portion; and an anode member disposed across an electron travel space region from said field emission electrode and extraction grid members.

2. The apparatus of claim 1 further including additional of said field emission electrode sources of electrons disposed in a multiple field emission cathoded microwave triode amplifier apparatus.

3. The apparatus of claim 2 wherein said microwave field effect transistor includes common source, and common gate elements and plural drain elements, one for each microwave field emission triode cathode and wherein said field emission microwave triode member includes a plurality of said cathodes together with common extractor and common anode elements therefor.

4. The apparatus of claim 3 wherein said microwave triode field emission cathodes are received on sheet resistance electrically isolated microwave transistor drain elements of said microwave field effect transistor.

5. The apparatus of claim 1 wherein said microwave triode member field emission electrode is both electrically and physically attached to said transistor drain element.

6. The apparatus of claim 1 wherein said field emission electrode source of electrons comprises a wedge shaped member having said apex portion disposed at an extraction grid adjacent end thereof.

7. The apparatus of claim 1 wherein said substrate member is comprised of gallium arsenide.

8. The apparatus of claim 1 wherein said anode member is received on a thermal energy dissipating member.

9. The method for operating a field emitting element, extractor element, and anode element inclusive microwave field emission triode electronic device comprising the steps of:

connecting said field emitting element of said electronic field emission triode device in electrical series with an output electrode element of a microwave transistor;

biasing a control electrode element of said microwave transistor and thereby said elements of said field emission triode device to common current flow enabling predetermined quiescent operating points of said microwave transistor and said field emission triode device;

generating amplified electrical signals at said anode element of said field emission triode device by modulating said biasing level of said microwave transistor control electrode element.

10. The method of claim 9 wherein said microwave transistor is a microwave field effect transistor, wherein said field emission triode field emitting element is connected with a drain electrode element of said microwave field effect transistor and wherein said biasing step also includes connecting gate and source control electrode elements of said field effect transistor plus extractor and anode elements of said microwave field emission triode to sources of predetermined electrical operating potential.

11. The method of claim 9 wherein said modulating of said biasing level comprises adding a radio frequency signal to said bias level.

12. Hybrid microelectronic microwave amplifier apparatus comprising the combination of:

a microwave transistor member having input, output and common electrodes;

a field emission triode member comprised of, a field emission electrode element having a geometric base region and a smaller dimensional geometric apex region of high electrical stress, said field emission electrode element being electrically and physically connected with a predetermined signal output of one of said microwave transistor electrodes, extractor element means having an aperture disposed proximate said field emission electrode element apex region for extracting electrons therefrom, an anode member disposed across an electron travel space from said field emission electrode element and extractor element.

13. The amplifier apparatus of claim 12 wherein said transistor input, output and common electrodes comprise gate, drain, and source electrodes respectively of a field effect transistor.

14. The amplifier apparatus of claim 12 wherein said field emission electrode element is disposed in the shape of a cone.

15. The apparatus of claim 12 wherein said field emission electrode element is disposed in the shape of a wedge.

16. The apparatus of claim 12 wherein said extractor element is connected to a node of zero radio frequency energy potential and wherein said extractor element extends above said microwave transistor in secondary electron and ion shielding configuration.

* * * * *

UNITED STATES PATENT AND TRADEMARK OFFICE

CERTIFICATE OF CORRECTION

PATENT NO. : 5,268,648

DATED : December 7, 1993

INVENTOR(S) : Mark C. Calcatera

It is certified that error appears in the above-identified patent and that said Letters Patent is hereby corrected as shown below:

Column 4, line 61, a dash should follow "device".

Column 6, line 2, "»" should be --«--

Column 7, line 20, "1" should be -- 7 --.

Column 8, line 67, delete "electrode".

Signed and Sealed this

Twentieth Day of September, 1994

Attest:

BRUCE LEHMAN

*Attesting Officer*

*Commissioner of Patents and Trademarks*